United States Patent
Abel et al.

(10) Patent No.: US 8,791,715 B2
(45) Date of Patent: Jul. 29, 2014

(54) METHOD FOR MONITORING A CONTROLLER OF A THREE-PHASE ELECTRIC MOTOR AND/OR THE ELECTRIC MOTOR

(75) Inventors: Falko Abel, Aufhausen (DE); Ralf Hochhausen, Lappersdorf (DE)

(73) Assignee: BSH Bosch und Siemens Hausgeraete GmbH, Munich (DE)

( * ) Notice: Subject to any disclaimer, the term of this patent is extended or adjusted under 35 U.S.C. 154(b) by 579 days.

(21) Appl. No.: 13/132,325

(22) PCT Filed: Nov. 24, 2009

(86) PCT No.: PCT/EP2009/065755
§ 371 (c)(1),
(2), (4) Date: Jun. 2, 2011

(87) PCT Pub. No.: WO2010/069722
PCT Pub. Date: Jun. 24, 2010

(65) Prior Publication Data
US 2011/0241723 A1    Oct. 6, 2011

(30) Foreign Application Priority Data
Dec. 19, 2008    (DE) .......................... 10 2008 055 012

(51) Int. Cl.
*G01R 31/34*    (2006.01)
(52) U.S. Cl.
USPC ..................................... 324/765.01; 318/700
(58) Field of Classification Search
CPC ................................ H02P 29/02; G01R 31/34
See application file for complete search history.

(56) References Cited

U.S. PATENT DOCUMENTS

| | | |
|---|---|---|
| 5,350,988 A | 9/1994 | Le |
| 6,822,416 B1 | 11/2004 | Kunz et al. |
| 2003/0222612 A1 | 12/2003 | Matsushita |
| 2004/0085087 A1* | 5/2004 | Zehentner et al. ............ 324/772 |
| 2005/0099743 A1 | 5/2005 | Lee |
| 2007/0278032 A1* | 12/2007 | Sakaguchi et al. ............ 180/446 |

FOREIGN PATENT DOCUMENTS

| | | |
|---|---|---|
| DE | 3041608 A1 | 6/1982 |
| DE | 4229554 A1 | 3/1994 |
| EP | 1403161 A1 | 3/2004 |
| GB | 2404100 A | 1/2005 |
| JP | 63202285 A | 8/1988 |
| JP | 2005094912 A | 4/2005 |
| JP | 2005312201 A | 11/2005 |
| JP | 2006184160 A | 7/2006 |
| JP | 2007089261 A | 4/2007 |
| JP | 2008263692 A | 10/2008 |

OTHER PUBLICATIONS

International Search Report PCT/EP2009/065755.
National Search Report DE 10 2008 055 012.4.

* cited by examiner

*Primary Examiner* — Minh N Tang
(74) *Attorney, Agent, or Firm* — James E. Howard; Andre Pallapies

(57) ABSTRACT

A method for monitoring a controller for controlling and/or monitoring a three-phase electric motor, in particular an asynchronous or synchronous motor, wherein two phase currents are measured and an error signal is generated if at least one of the two measured phase currents is essentially zero. An error signal is also generated if none of the two measured phase currents is essentially zero, but a sum formed of the two measured phase currents is essentially zero.

9 Claims, 2 Drawing Sheets

METHOD FOR MONITORING A CONTROLLER OF A THREE-PHASE ELECTRIC MOTOR AND/OR THE ELECTRIC MOTOR

BACKGROUND OF THE INVENTION

The invention relates to a method for monitoring a controller for controlling a three-phase electric motor and/or for monitoring the electric motor, especially an asynchronous or synchronous motor.

The use of single-phase split-pole motors in dishwasher drain pumps is known. These motors are designed for a discrete operating point and are directly connected to an electrical mains voltage. The loss of the single phase leads to the motor stopping and can be immediately recognized from the absence of the phase current.

BRIEF SUMMARY OF THE INVENTION

The underlying object of the invention is to specify a method to enable the functions of a controller for controlling an electric motor and/or the functions of the electric motor, especially of a household appliance, to be checked. In particular an electric motor is to be used which possesses more versatile characteristics by comparison with the split-pole motor mentioned above.

This object is inventively achieved by the method for monitoring a controller for controlling a three-phase electric motor and/or for checking the electric motor, especially an asynchronous or synchronous motor, comprising at least the following steps: Measuring 2 phase currents (ia, ib)

- Checking whether one of the 2 measured phase currents (ia, ib) is essentially zero,
- Generating an error signal if at least one of the 2 measured phase currents (ia, ib) is essentially zero,
- Checking whether the 2 measured phase currents (ia, ib) are essentially not equal to zero,
- Forming the sum of the 2 measured phase currents (ia, ib), and
- Generating an error signal if the sum formed of the 2 measured phase currents (ia, ib) is essentially zero.

In the system described here the measured currents are investigated in respect of a possible error combination in respect of whether one of the measured currents is zero and the other is not and/or the sum of the measured currents is essentially zero. If at least one of the conditions is fulfilled an error signal is output that indicates that the controller and/or the electric motor is or are not operating correctly.

In this context it should be noted that if a phase is missing, the phase current in the missing phase is zero and in the two other phases is an opposed current of equal size (phase opposition). Since the two phase currents are sine-wave currents, which each have a value of zero every 180° and since the three-phase currents also each have the value zero every 180°, account must be taken in the inventive method that the condition "is zero" is permitted for a certain period of time and does not provide any information as to functional capabilities. The current measurement of the phase currents mentioned is also subject to a tolerance so that preferably limits (of a tolerance band) will be defined within which a phase current can be assumed to be zero. Likewise limits (second tolerance band) are specified within which the difference between two phase currents must lie in order to identify the two phase currents as opposing each other, It is always sufficient in the inventive method to only measure two of the three-phase currents, since the three phases of the synchronous motor are connected in a star configuration. Since the sum current of the node point of the star circuit is zero the entire three-phase system can be detected from the two measured phase currents, thus the absent phase winding current or phase current can be determined. If the phase is missing a distinction must be made as to whether one of two current measurement facilities which carry out the current measurements is positioned in the associated phase winding, or whether this phase winding is the one to which no current measurement facility is assigned.

Preferably a second counter is incremented if, within a defined period of time, the first counter exceeds a first prespecifiable threshold value a number of times.

Preferably the loss of at least one phase current, i.e. the failure of at least one phase of the asynchronous or synchronous motor, is detected if the second counter exceeds a second, especially prespecifiable threshold value. This method provides high reliability in the detection of the loss of at least one phase of the synchronous motor.

In particular the second counter can be incremented and a timer started if the first counter exceeds the first threshold value. The first counter is preferably reset if it exceeds the first threshold value. The second counter is especially further incremented if, within the defined period of time, the first counter exceeds the first threshold value least one further time. Depending on the reliability of the information, there can be provision for the first counter to have to exceed the threshold value not just one further time but more than twice. The said defined period of time especially involves a prespecifiable time period of the said timer.

The invention further relates to a facility for functional monitoring of an electric motor of a household appliance, especially for carrying out the method mentioned above, whereby the electric motor is embodied as a three-winding, three-phase, permanently-excited synchronous motor connected in a star configuration and is provided with a field oriented vector regulation, and two phase currents are measured by means of a measuring device and the measuring results are analyzed by means of the detector circuit for monitoring the speed of the synchronous motor and/or for monitoring a presence of all phase currents in the phase windings of the synchronous motor.

The invention further relates to a household appliance, especially a dishwasher or a washing machine, whereby the household appliance is provided with a facility of the said type.

DETAILED DESCRIPTION OF EXEMPLARY EMBODIMENTS OF THE PRESENT INVENTION

The invention is based on a three-winding, three-phase, permanently-excited synchronous motor of a household appliance, especially of a dishwasher or washing machine, with the synchronous motor for example driving a pump of the household appliance which serves as a drain pump and/or as a recirculation pump.

Figure 1:
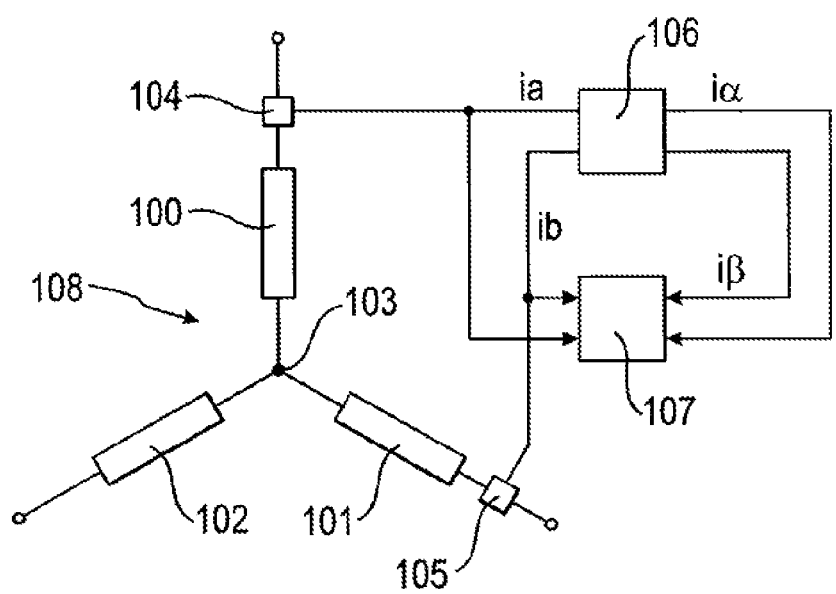
FIG. 1 shows a structure diagram which allows the functions of asynchronous motor to be monitored and FIG. 2 shows a regulator set circuit diagram of a vector regulation for a three-phase, permanently-excited synchronous motor.

FIG. 1 depicts three phase windings 100, 101 and 102 of a three-winding, three-phase, permanently-excited synchronous motor 108, with the three-phase windings 100 to 102 being connected together in a star configuration 103. Each of the phase windings 100 and 101 is assigned a current measuring facility 104, 105 which measures the associated phase currents ia and ib. The phase currents ia and ib are converted by means of a device 106 into component currents iα, iβ, especially transformed. The two phase currents ia, ib and/or the two component currents iα, iβ are supplied to a detector circuit 107 which undertakes monitoring of the speed n of the synchronous motor 108 and/or monitoring for the presence of all three phase currents in the three-phase windings 100, 101, 102 of the synchronous motor 108. Since the sum current in the star point 103 is zero it is sufficient only to measure the phase currents ia and ib in the two phase windings 100 and 101. The phase current in phase winding 102 can then be calculated. To clarify terminology it should also be pointed out that "phase windings" are referred to if the physical operative system is involved and "phases" if the process involves generating a voltage system.

The synchronous motor 108 is controlled with a so-called field-oriented vector regulation. The two phase currents ia and ib are used for this purpose, in order, taking into account a motor model of the synchronous motor 108, to be able to control said motor with a three-phase pulse width modulated voltage system. The frequency, the phase position and the amplitude of this voltage system can be adjusted. Power is consequently fed to the synchronous motor 108 with a so-called modulator.

The phase winding currents ia, ib, which can also be referred to as phase currents, are—as mentioned—measured with the aid of the two current measurement facilities 104 and 105. The two current measurement facilities 104 and 105 each have a shunt resistor, with the voltage drop occurring at the respective shunt resistor being directly proportional to the associated phase current ia or ib respectively.

Figure 2:
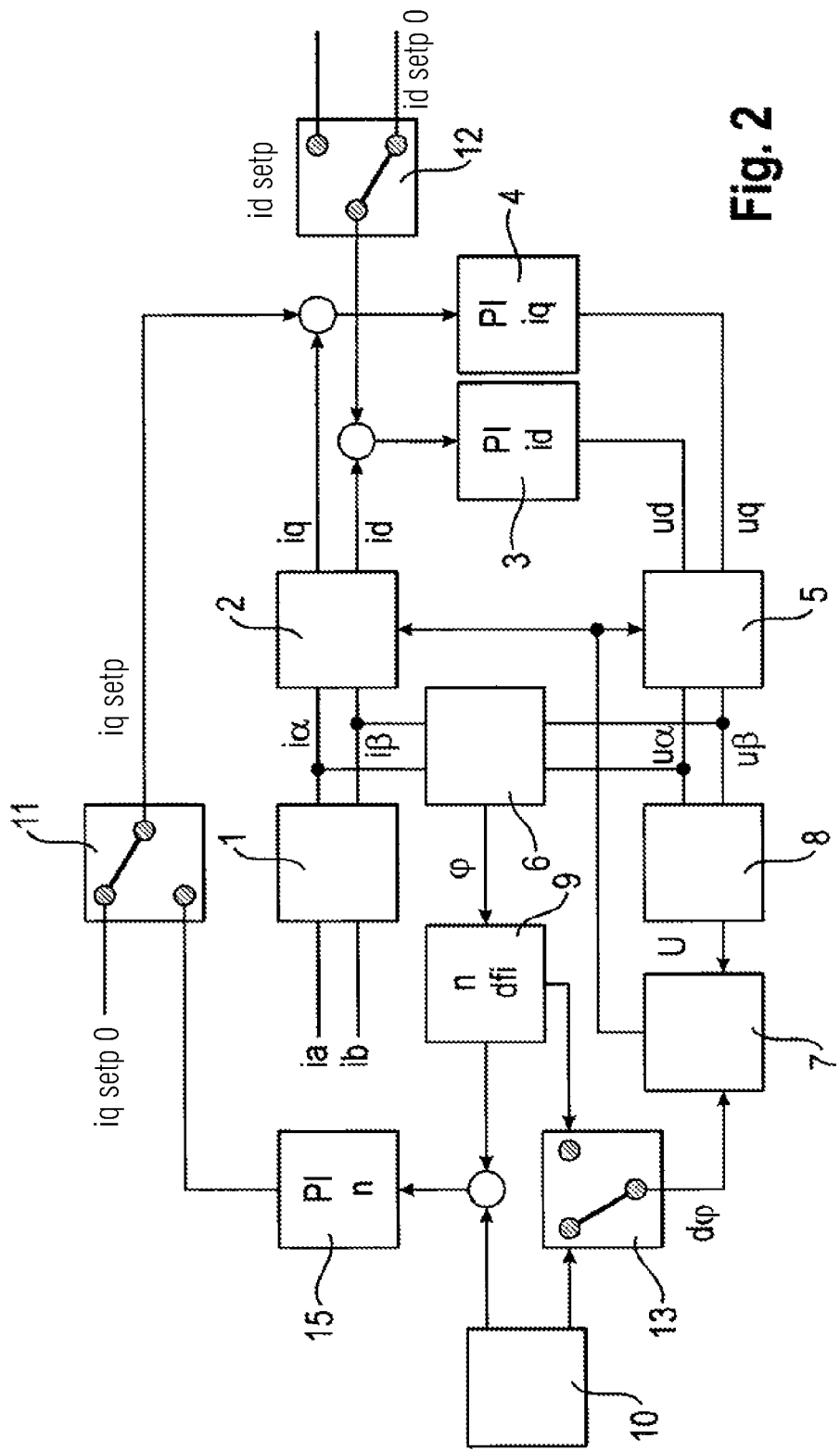

FIG. 2 illustrates the regulation circuit for field-oriented vector regulation with the aid of a regulator set circuit diagram. The two phase winding currents ia, ib are measured from the three-phase current system, having currents offset by 120°. This is done with the current measurement facility 104, 105 in accordance with FIG. 1. With the aid of a Clark transformation labeled 1 (device 106 in FIG. 1) the two real phase currents ia, ib offset by 120° are converted into a complex, stator-oriented orthogonal coordinate system, meaning that a two-phase 90° system is now present comprising the component currents iα and iβ. These two component currents iα and iβ are inverted with the aid of a Park transformation labeled 2 via the rotor angle φ into the rotor coordinate system. This results in the rotated current components id and iq, with id corresponding to the magnetization current and iq to the torque-generating current of the synchronous motor. These current components id and iq are regulated in the downstream regulator stages 3 and 4 to different setpoint values id setp and iq setp. Subsequently an inverse transformation is undertaken which is identified by the reference character 5 and which, as well as the component voltages uα and uβ for a motor model 6, also delivers amplitudes for a modulator 7. The modulator 7 involves an element which is able to generate a three-phase pulse width modulated voltage system of which the frequency, phase position and amplitude are adjustable. Such a modulator 7 is also referred to as a converter. For providing the amplitudes of the component voltages uα and uβ an absolute value generator 8 is provided on the input side of the modulator 7. The already mentioned rotor angle φ (rotor displacement angle) is not measured directly at the synchronous motor 108 but computed with the aid of the motor model 6 from the component currents iα and iβ and the component voltages uα and uβ. The motor model 6 emulates the synchronous motor 108. From the temporal differentiation of the rotor angle the speed n is computed. This is indicated by the reference character 9. From the speed n, with the knowledge of discrete modulation step times, a current angle step for the modulator 7 is computed. Since at the start point of the synchronous motor 108 no current and speed information is available, the synchronous motor 108 will be started up in a controlled manner. For this purpose a ramp model labeled 10 is provided, which generates a current target speed and a current angle step in accordance with a start ramp incline. The setpoint values for the two current components id and iq are specified as fixed values. FIG. 2 contains three switches 11, 12 and 13, which each assume a position necessary for starting up the synchronous motor 108. Once the synchronous motor 108 has started up, it is switched over. During start-up the modulator 7 runs through a sine wave table for generating an output voltage pattern with the angle increment of the ramp of the ramp model 10 and the amplitude from the current regulator circuits of the setpoint start-up values. If a defined speed n is reached at which the winding current values ia, ib can be safely measured and the motor model 6 safely calculated, a switchover is made from controlled into regulated operation, meaning that the switches 11 to 13 are switched over and a synchronization point is produced. A speed regulator 15, which is embodied as a PI regulator, now computes in accordance with an existing speed variation a setpoint value iq setp for the current component iq generating the torque. The magnetizing current component id is regulated to zero.

In respect of the measurement of the phase currents iα and iβ it should be pointed out that these are measured with the aid of the two shunt resistors of the current measurement facilities 104, 105 in the foot points of the motor windings of the synchronous motor 108. A half bridge circuit is especially provided in the modulator 7. The voltage drops and the two shunt resistors are rapidly adapted with the aid of two fast amplifier circuits to a voltage measurement range of a microcontroller from 0 V to 5 V. The amplifier circuits are identically constructed and are dimensioned so that a voltage measurement within the framework of a pulse width modulation without distortion is possible. Since in the two foot points positive and negative currents of the same amplitude have to be measured, the amplifier circuits each possess an offset voltage which is to be found in the middle of the possible control range. The respective offset voltage is constantly measured when the motor is stopped and is checked for plausibility. To minimize the influence of faults, the offset voltages are filtered by SW lowpasses. In the event of an implausible offset voltage, converter software assumes an error state in which control of the pump is not possible.

The phase currents ia and ib are sampled under interrupt control carried out with pulse-width-modulation frequency of a pulse width modulator of the converter. The sampling time lies in the middle of the control of three low-side power semiconductors of the converter. At this point in time the three motor windings of the synchronous motor 108 are short-circuited via the power semiconductors and a freewheeling current of the motor windings can be measured. Since the triggering of the sampling lies precisely in the middle of the impulse, the influence of faults as a result of pulse width modulation switching flanks is minimized. During a pulse width modulation cycle only one current is ever sampled. The two currents are measured offset in time by the pulse width modulation cycle time before the calculation of the motor model. It is a requirement in this case that the current in the phases of the synchronous motor is constant during a pulse width modulation cycle time. The pulse width modulation frequency is selected so that this condition is fulfilled. The currents are detected with an analog-digital converter resolution of 10 bits. With this resolution the peak-to-peak value of the phase currents is mapped.

A modulation of output voltages of the converter is implemented in accordance with a look up table (LUT) method. The current angle of the output voltage is stored in a phase accumulator (16-bit) and corrected cyclically every 600 μs by a regulation algorithm. Between the corrections a modulation angle is continued with a constant angular speed. The LUT has a resolution of 16 bits and is stored with 256 checkpoints in a flash memory of a controller. The pulse width modulation values are updated in each second pulse width modulation cycle. The output voltages are corrected with the aid of an intermediate circuit voltage of the converter during each modulation value computation. This enables an influence of a voltage ripple in the intermediate circuit of the converter to be largely compensated for.

As explained above, a transformation step is undertaken in the said field-oriented vector regulation in order to convert the phase winding currents ia and ib into the component currents iα and iβ. This transformation step is purely algebraic and does not contain any models. As mentioned, the component currents iα and iβ describe the three-phase current system in an orthogonal presentation. An angle with stator reference is computed from the two component currents iα and iβ. The measurement is repeated at defined time intervals. The spacings are preferably selected such that they satisfy the requirements of error detection. From the ongoing measurements, by differentiation of the angle in accordance with the time an angular speed is computed and as a consequence thereof a speed n of the synchronous motor 108. Preferably the angle difference of adjacent angles and the time difference of adjacent times are formed and the angle difference is divided by the time difference for the differentiation.

Since current samples can be discarded, which means that the time association of two current samples for ia and ib can change and the measurement is more imprecise in the lower speed range, the speed can preferably be filtered. As an alternative to filtering it is advantageous to apply a selection criterion. Provided y-values of x-values correspond to a default, it is assumed that the result is correct.

As already mentioned, the three phase windings 100 to 102 of the synchronous motor 108 are connected in a star configurations. Since the sum current of a node point is zero, it is thus sufficient to measure two of the three phase windings. This has already been explained with reference to FIG. 1. If a phase is missing, i.e. if a phase current of a phase fails, a distinction must be made as to whether one of the two current measurements is positioned in this phase or whether this involves the non-measured phase. A check should thus be made whether one of the two current measurement facilities 104, 105 lies in this phase or not.

If a phase is missing, the current in the missing phase, i.e. in the phase winding concerned, is zero and in the other two phases/phase windings is opposed and equal in size. So-called phase opposition is thus present. Since the two phase currents ia, ib are each zero every 180° (sine-wave currents) and also the three-phase currents are each zero every 180°, account must be taken during measurement for zero current of the fact that this state is allowed for a certain period of time. The current measurements by means of the current measurement devices 104 and 105 are each subject to a tolerance, so that certain limits must be defined within which a current is assumed to be zero. Likewise limits are needed within which the difference between two currents can lie in order to identify the two currents as opposing one another. In the first case a first tolerance band is defined as limits and in the second case a second tolerance band. To monitor the completeness of the phase windings of the synchronous motor 108, i.e. whether at least one phase of the synchronous motor 108 has failed, the two measured currents ia and ib are investigated in respect of the following possible error combinations: a) if one of the two measured phase winding currents ia, ib lies within the first tolerance range, this phase-winding current is assumed to be zero, b) if the difference between the two measured phase winding currents ia, ib lies within the second tolerance range, the two measured phase winding currents are assumed to be opposing one another in phase opposition.

In step a) an investigation is undertaken as to whether one of the two currents ia, ib lies below the zero-current limit defined by the first tolerance band. In step b) an investigation is undertaken as to whether the difference between the measured currents ia, ib lies below the phase opposition limit defined by the second tolerance band.

Basically it should be pointed out that in principle it is simpler to detect a zero current than a phase opposition. If one of the two said events occurs, a first counter is incremented, especially increased weighted in accordance with the type of event. If a measurement fulfils neither the one nor the other criterion, the first counter is reset.

If this first counter exceeds a first threshold, a second counter is incremented and the first counter is reset and also a timer is started. If within a defined period of time, especially the specified timer time, the first threshold value of the first counter is exceeded a second time or at least a second time, the second counter is incremented again. If this situation does not occur, the second counter is reset. If the second counter exceeds a second threshold value, loss of a phase, i.e. the absence of a phase-winding current in a phase winding 100, 101, 102, is detected.

To summarize, it can be stated for the method for speed detection that the component currents iα and iβ of a transformation step of the field-oriented vector regulation are used without any model creation. Stator-oriented angles are always computed at at least two defined points in time, with the time difference only having to satisfy the accuracy requirements for detecting the stationary state (taking account of the subsequent filter/the subsequent analysis). This is followed by the computation of the speed (approximated speed) from the temporal differentiation of the angle. In addition a weighting of the speed information (especially y of x speed values within a tolerance) is undertaken.

The check for completeness of the phase windings measures two phase winding currents of the star-connected synchronous motor. A weighted increase of a first counter is undertaken if either a current lies below a zero current threshold or the difference between two currents lies within a phase opposition threshold. A second counter is increased if the first counter exceeds a (first) threshold of the first, weighted counter within a defined period of time. The loss of a phase is detected if the second counter exceeds a (second) threshold assigned to it.

The invention claimed is:
1. A method for monitoring a controller for controlling and/or monitoring a three-winding, three-phase, permanently-excited synchronous electric motor connected in a star configuration in a household appliance, said method comprising the steps of:
measuring two out of three phase currents;

checking whether one of the two measured phase currents is essentially zero;

generating a first error signal when at least one of the two measured phase currents is essentially zero;

checking whether both of the two measured phase currents are essentially not equal to zero;

forming a sum of the two measured phase currents;

generating a second error signal when the formed sum of the two measured phase currents is essentially zero;

incrementing a first count when either the first error signal or the second error signal occurs;

incrementing a second count when the first count repeatedly exceeds a first threshold within a defined period; and determining a loss of at least one phase current when the second count exceeds a second threshold, wherein the two measured currents are used to control the synchronous motor with a field oriented vector regulation.

2. The method of claim 1, further comprising starting a timing operation when the first count exceeds a first threshold within a defined period.

3. The method of claim 2, wherein the defined period is a specifiable time.

4. The method of claim 1, wherein the first count is reset when exceeding the first threshold.

5. The method of claim 1, wherein the second count continues to be incremented as long as the first count exceeds the first threshold within the defined period.

6. The method of claim 1, wherein the electric motor is used to operate a dishwasher or a washing machine.

7. A household appliance, comprising:

a three-winding, three-phase, permanently-excited synchronous electric motor connected in a star configuration;

a controller for controlling and/or monitoring the motor, wherein the controller is adapted to measure two out of three phase currents;

check whether one of the two measured phase currents is essentially zero;

generate a first error signal when at least one of the two measured phase currents is essentially zero;

check whether both of the two measured phase currents are essentially not equal to zero;

form a sum of the two measured phase currents;

generate a second error signal when the formed sum of the two measured phase currents is essentially zero;

increment a first count when either the first error signal or the second error signal occurs;

increment a second count when the first count repeatedly exceeds a first threshold within a defined period; and determine a loss of at least one phase current when the second count exceeds a second threshold, wherein the two measured currents are used to control the synchronous motor with a field oriented vector regulation.

8. The household appliance of claim 7, constructed in the form of a dishwasher or a washing machine.

9. A household appliance, comprising:

a three-winding, three-phase, permanently-excited electric motor connected in a star configuration for operating a component of the household appliance;

a current measuring device configured to measure phase currents of at least two of the three phase windings;

a detector circuit which checks whether or not the measured phase currents have non-zero values and;

generates a first error signal if one of the at least two measured phase currents is essentially equal to zero, generates a second error signal if none of the at least two measured phase currents is essentially equal to zero, but if a sum formed of two measured phase currents is essentially zero, increments a first count when either the first error signal or the second error signal occurs;

increments a second count when the first count repeatedly exceeds a first threshold within a defined period; and determines a loss of at least one phase current when the second count exceeds a second threshold, wherein the two measured currents are used to control the synchronous motor with a field oriented vector regulation.

* * * * *